United States Patent
Takeuchi

(10) Patent No.: US 7,528,591 B2
(45) Date of Patent: *May 5, 2009

(54) PWM CONTROL SYSTEM

(75) Inventor: Kesatoshi Takeuchi, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/897,353

(22) Filed: Aug. 30, 2007

(65) Prior Publication Data
US 2008/0001561 A1    Jan. 3, 2008

Related U.S. Application Data

(62) Division of application No. 10/558,664, filed as application No. PCT/JP2004/007602 on Jun. 2, 2004, now Pat. No. 7,315,155.

(30) Foreign Application Priority Data
Jun. 2, 2003     (JP) .............................. 2003-157213

(51) Int. Cl.
    G05B 11/28    (2006.01)
    G05F 1/10     (2006.01)
(52) U.S. Cl. ...................... 323/282; 363/97; 318/599
(58) Field of Classification Search ................ 363/21.1, 363/21.11, 21.18, 41, 97, 98, 131, 132; 323/271, 323/282, 283, 284, 351; 318/599, 608, 650, 318/671, 683, 684
See application file for complete search history.

(56) References Cited

U.S. PATENT DOCUMENTS

| 4,599,545 | A |   | 7/1986  | Moriki et al. |             |
|-----------|---|---|---------|---------------|-------------|
| 4,625,156 | A |   | 11/1986 | Komiya et al. |             |
| 4,727,530 | A | * | 2/1988  | Tomisawa      | 369/47.45   |
| 4,779,183 | A |   | 10/1988 | Mutoh et al.  |             |
| 4,973,876 | A |   | 11/1990 | Roberts       |             |
| 5,086,261 | A | * | 2/1992  | Sakata et al. | 318/268     |
| 5,548,679 | A | * | 8/1996  | Kiyota        | 388/811     |
| 6,118,680 | A |   | 9/2000  | Wallace et al.|             |

FOREIGN PATENT DOCUMENTS

| EP | 0 840 458 | 5/1998 |
|----|-----------|--------|
| JP | 60-74972  | 4/1985 |

(Continued)

OTHER PUBLICATIONS

Communication from European Patent Office regarding counterpart application.

(Continued)

*Primary Examiner*—Gary L Laxton
(74) *Attorney, Agent, or Firm*—Harness, Dickey & Pierce, P.L.C.

(57) ABSTRACT

A PWM control system, comprising PWM fundamental wave generation means for forming a PWM fundamental wave by dividing a fundamental frequency signal; PWM cycle setting means for setting a PWM cycle on the basis of the PWM fundamental wave; duty ratio formation means for forming a duty ratio (N/M:N$\leq$M, where M is the maximum number of clocks) in the PWM cycle; and PWM control signal output means for outputting a PWM control signal with the duty ratio to a load drive circuit.

16 Claims, 9 Drawing Sheets

FOREIGN PATENT DOCUMENTS

| | | |
|---|---|---|
| JP | 60-241784 | 11/1985 |
| JP | 07-163189 | 6/1995 |
| JP | 10-190467 | 7/1998 |
| JP | 2000-037079 | 2/2000 |
| JP | 2000-66702 | 3/2000 |
| JP | 2000-324842 | 11/2000 |
| JP | 2002-17089 | 1/2002 |
| JP | 2002-44981 | 2/2002 |
| JP | 2002-272160 | 9/2002 |

OTHER PUBLICATIONS

International Search Report for PCT/JP2004/007602; dated Sep. 7, 2004; ISA/JP.

* cited by examiner

PWM CONTROL SYSTEM

CROSS REFERENCE TO RELATED APPLICATIONS

This application is a divisional patent application of U.S. Ser. No. 10/558,664 filed Nov. 29, 2005, which is a national phase of PCT/JP2004/007602 filed Jun. 2, 2004, claiming priority to Japanese Patent Application No. 2003-157213 filed Jun. 2, 2003, all of which are incorporated by reference.

CROSS-REFERENCES

The present invention relates to a PWM control system. The PWM control system of the present invention can be used for drive-controlling a variety of loads such as AC motors and DC motors including pulse motors. The PWM drive control system of the present invention can be widely applied as long as the drive circuit of the load can be drive-controlled using a duty ratio in accordance with the operating state of the load that is the target of control such as motor control, display device control, speech output control, oscillation control, touch sensitivity control, atomization control, and mixing control.

BACKGROUND

Conventionally, a PWM system drives a DC motor, for example, producing a drive command signal for a preset PWM cycle, setting the duty ratio of the drive command signal to obtain the torque required for the DC motor, and causing a switching element to perform switching.

In a system block of a DC motor drive apparatus, a CPU for controlling the whole of the DC motor and a PWM control section that receives commands from the CPU via a system bus and produces a drive command signal are provided. The duty ratio of the drive command signal is set to be proportional to the torque required for the DC motor.

Further, Japanese Patent Application Laid Open No. H7-163189, for example, mentions a PWM motor control system using a switching signal that compares a reference signal with a predetermined waveform that is triangular or the like and a command signal for the motor and PWM-modulates the reference signal by means of the command signal.

In addition, Japanese Patent Application Laid Open No. 2000-37079 discloses a PWM circuit comprising a CPU that sets control information and the output of a signal wave constituting a command value based on a signal wave reference signal that is inputted from outside, a PLL circuit to which the signal wave reference signal is inputted that outputs a phase reference signal indicating that a pulse the frequency of which is a fixed multiple of the frequency of the signal wave reference signal and a signal wave reference signal have reached a specified phase, a divider that divides the pulse outputted by the PLL circuit at a division ratio that is preset by the CPU, an up/down counter to which the output of the divider is inputted and which sets a predetermined value that is preset at the timing of the phase reference signal from the PLL circuit, repeats the up and down count between two predetermined values that are set separately from the former predetermined value thus set, and outputs a carrier wave, a comparator that compares the carrier wave and signal wave and, depending on the size of the carrier wave and signal wave, outputs a switching signal that controls the ON/OFF of the switching element of the output converter, the PWM circuit comprising a first register that temporarily holds the division ratio of the divider that is set by the CPU, and a second register to which the temporarily held division ratio is inputted with the timing of the phase reference signal from the PLL circuit and which holds the division ratio and causes the divider to reflect the division ratio. In this PWM circuit, the duty ratio of the drive signal supplied to the load is changed in accordance with the ON/OFF of the switching signal.

SUMMARY

In order to increase the operating efficiency of a load and so forth, a drive method that allows the PWM cycle to fluctuate has become necessary. However, with conventional control systems, the PWM drive frequency is used only in a fixed state. Further, an analog circuit for producing a sawtooth wave is required by a conventional PWM control system.

Therefore, in order to solve this problem, an object of the present invention is to provide a PWM control system that that allows the PWM cycle to be changed, the duty ratio to be set in accordance with the operating state of the load, and which permits formation using full logic.

In order to achieve this object, the present invention is a PWM control system, comprising PWM fundamental wave generation means for forming a PWM fundamental wave by dividing a fundamental frequency signal; PWM cycle setting means for setting a PWM cycle on the basis of the PWM fundamental wave; duty ratio setting means for setting a duty ratio (N/M:N≦M, where M is the maximum number of clocks) for each single cycle of the PWM; and PWM control signal output means for outputting a PWM control signal with the duty ratio to a load drive circuit.

In an embodiment of the present invention, the PWM cycle setting means sets a number of clocks corresponding with the M value of the PWM fundamental wave as the PWM cycle. The PWM control system further comprises control characteristic setting means for determining the division value (M) and duty ratio set value (N) in accordance with the operating state of the load. The PWM fundamental wave generation means forms a PWM fundamental frequency signal by M-dividing the fundamental frequency signal by means of a PLL circuit. The PWM control signal output means outputs the AC PWM control signal by switching the polarity of the outputted PWM control signal. The PWM fundamental wave generation means is constituted to lock the PWM cycle to the cycle of the AC drive frequency signal.

The present invention further comprises load operating state detection means; load operating state command means; a PLL circuit for dividing the fundamental wave at a division ratio corresponding with the operating command state; and comparing means for comparing the output from the PLL circuit and the load operating state detection value, wherein the comparison result is supplied to the aforementioned PWM control system, and the PWM control signal of the duty ratio corresponding with the comparison result is outputted to the load drive circuit.

The present invention makes it possible to perform modulation on the PWM fundamental wave to change the PWM cycle and perform modulation on the PWM fundamental wave to change the duty ratio in accordance with the operating state of the load, and therefore changes to the PWM cycle and changes to the duty ratio can be reliably executed without using an analog circuit.

DETAILED DESCRIPTION

Figure 1:
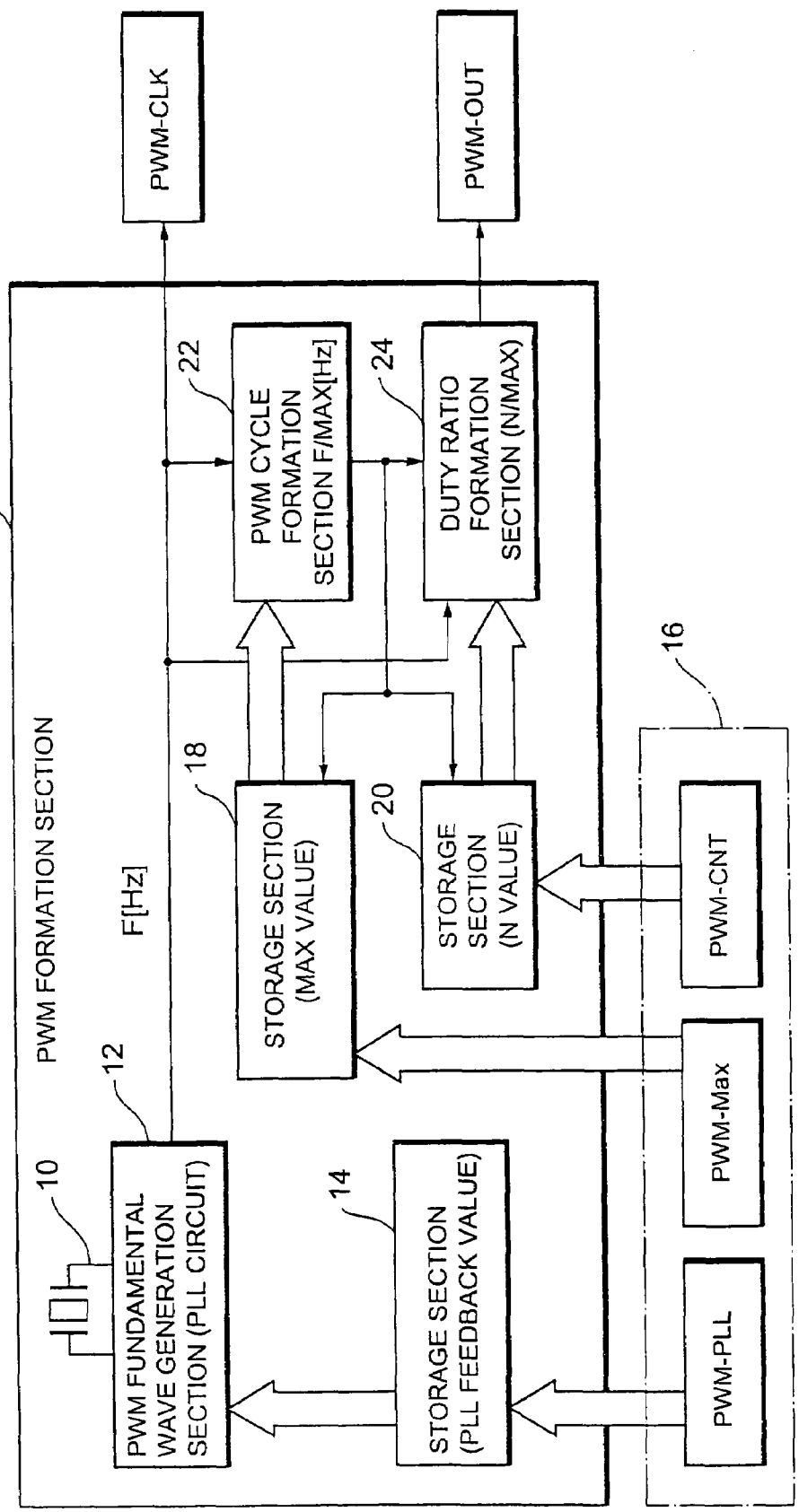
FIG. 1 is a function block diagram of a PWM control block according to the present invention.

FIG. 1 is a representative function block diagram of a PWM control system 1 according to the present invention. This PWM control system is a drive control system of a DC motor. In FIG. 1, numeral 10 is a liquid-crystal emitter, numeral 12 is a PWM fundamental wave generation section comprising a PLL circuit that divides the oscillation frequency of the liquid-crystal emitter. The division efficiency is determined by a CPU 16 and set in a register 14. A clock signal (F(Hz)) of the PWM control fundamental wave, the fundamental frequency clock of which is divided by the PLL circuit, is formed.

Figure 2:
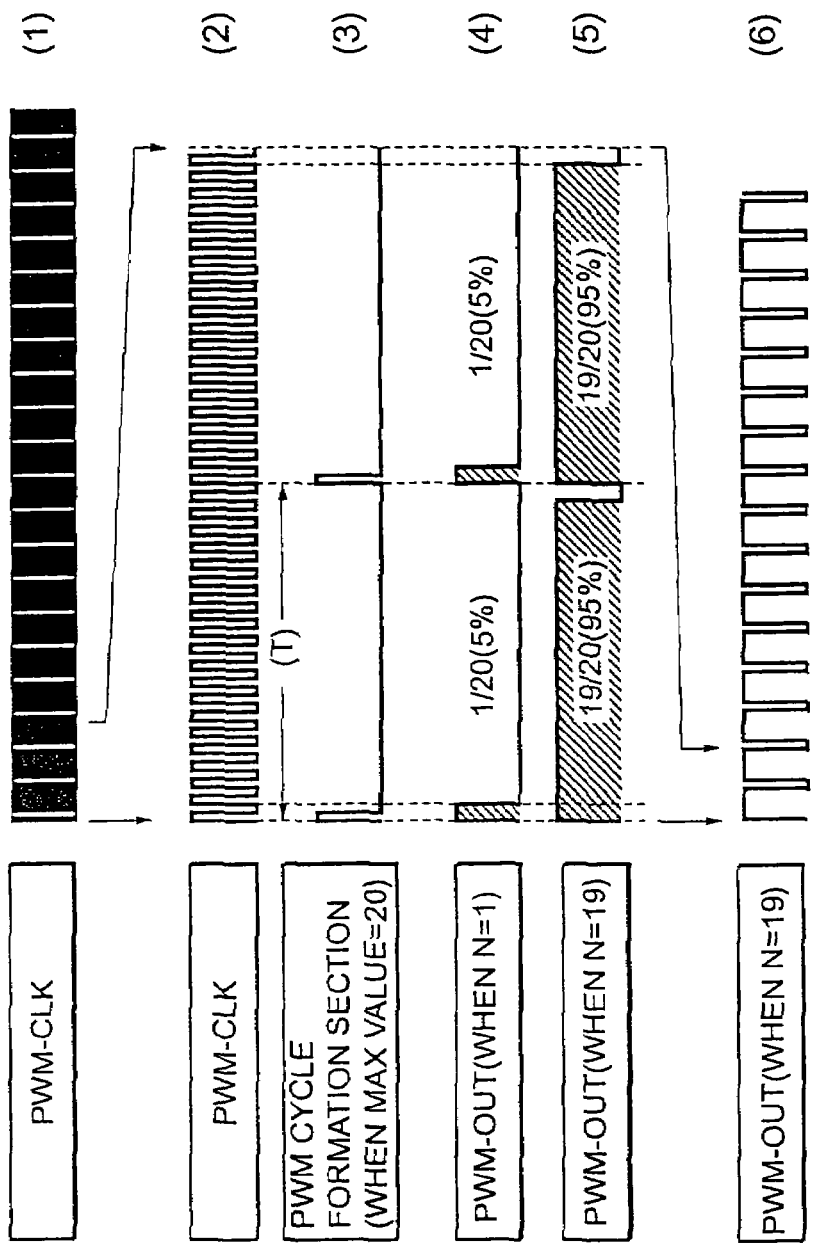
FIG. 2 is a waveform characteristic view of the PWM control block.

(1) in FIG. 2 shows the clock (PWM-CLK) of the PWM control fundamental wave. Numeral 18 in FIG. 1 is a register for control parameters for forming the PWM cycle, the parameters being established and stored as maximum values for setting the duty ratio (described subsequently). Numeral 20 is a register for duty control parameters (N) of the PWM control wave. The M and N values are established in the register by the CPU that establishes the relational characteristics of the load operating states and numerical values in the memory. The PWM control of complex patterns can be implemented by establishing N values in a numerical value table. Further, by determining the N values from an analog comparator, PWM control can also be implemented from an analog signal.

(2) in FIG. 2 is an enlarged view of the clock of the PWM control fundamental wave. When the M value for establishing a PWM cycle is determined by the CPU 16 for controlling the whole of the system in FIG. 1, as per (3), the frequency of the PWM fundamental wave is divided into (1/M) and a pulse for determining the PWM cycle is outputted for every M pulses of the fundamental wave. As a result, the PWM cycle (T) is set as a period that is M pulses' worth of the fundamental wave (1). Further, a case where M=20 is shown in FIG. 2. The divider circuit of a PWM cycle formation section (PWM cycle setting means) 22 is constituted to read the set value in a register 18 and output the PWM cycle pulse with the PWM fundamental clock as (1/M).

The duty ratio formation section 24 comprises a counter that is reset each time a PWM cycle pulse is inputted, and reads N values stored in a register 20, measures N clocks' worth of the PWM fundamental clocks in the PWM cycle, and outputs a drive signal (PWM-OUT) with the N/M duty ratio.

(4) and (5) in FIG. 2 are waveform characteristics that represent a PWM-modulated drive control command signal wave with an N/M duty. (4) is a control waveform with a duty ratio of N/M=1/20(5%) and (5) is a control waveform with a duty ratio of N/M=19/20(95%). The control waveform (PWM-OUT) is outputted to the drive circuit of various loads.

Figure 3:
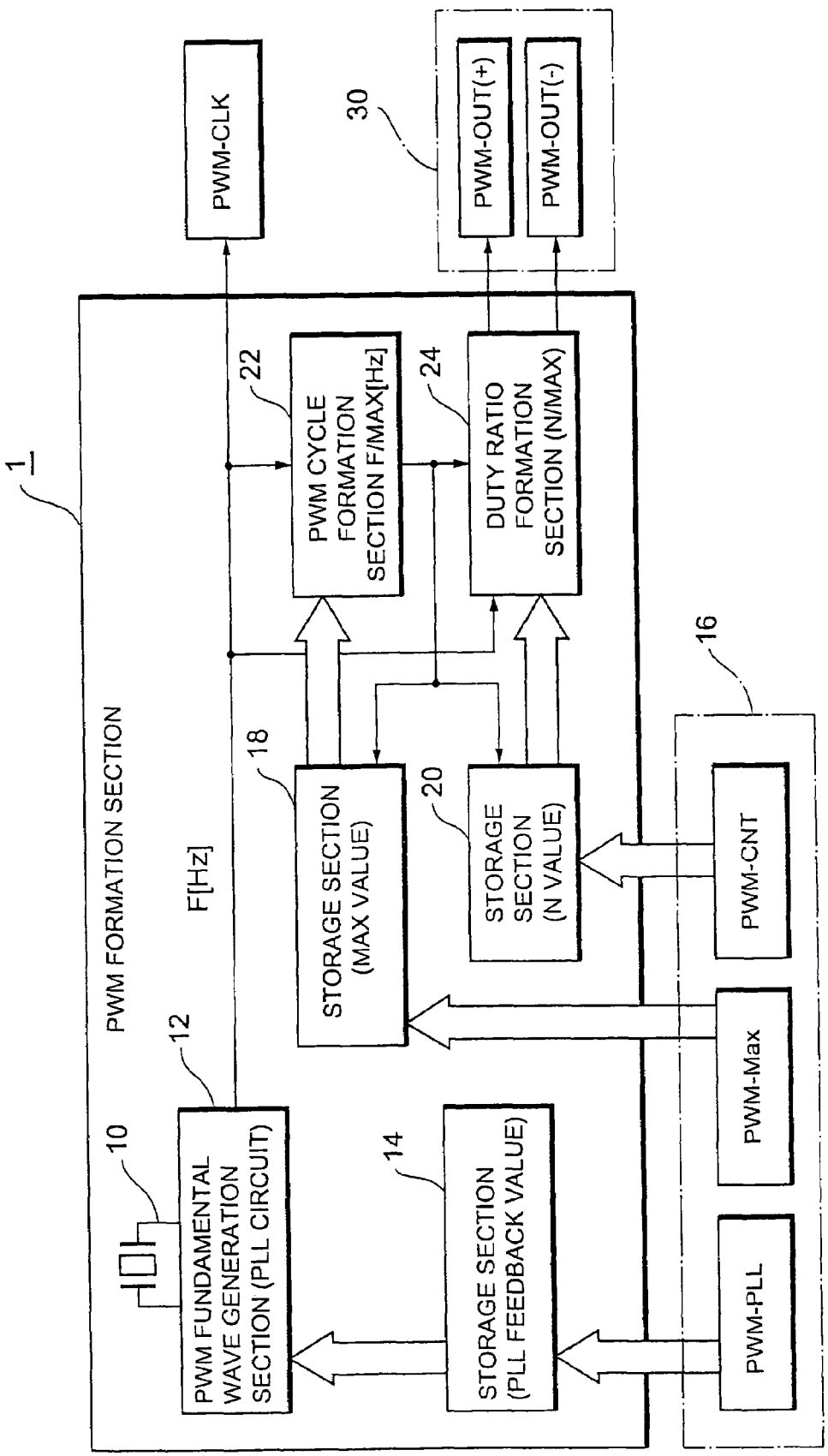
FIG. 3 is a function block diagram of a PWM control block according to a second embodiment.
Figure 4:
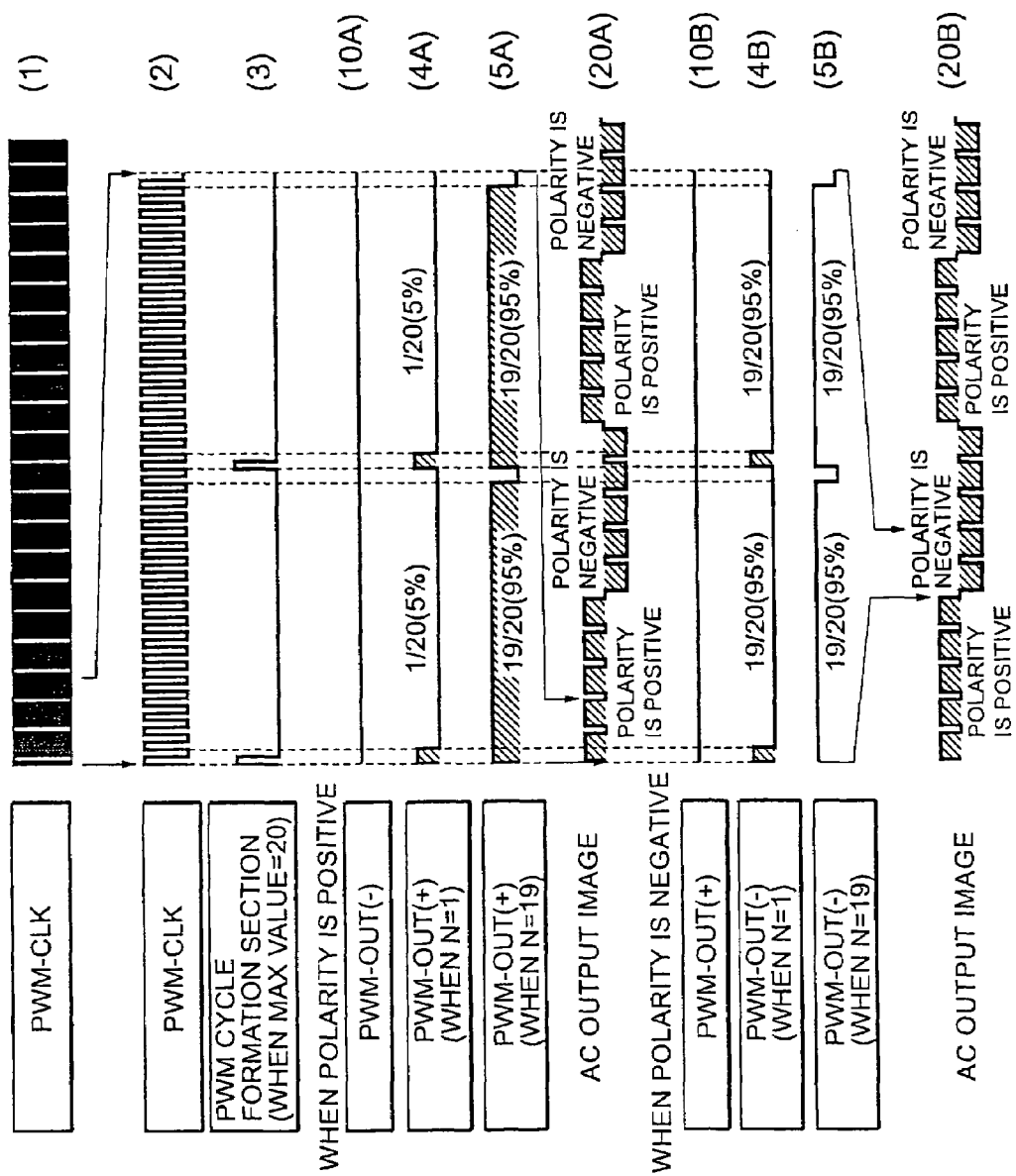
FIG. 4 is a waveform characteristic view of the PWM control block according to the second embodiment.

FIG. 3 relates to the second embodiment and, with respect to the parts that are different from those of the embodiment in FIG. 1, the duty ratio formation section 24 comprises polarity switching means 30. The polarity switching means alternately outputs the PWN control pulse with the duty ratio N/M by switching the polarity. 4A and 5A in FIG. 4 are waveforms for which the duty ratio is controlled when the polarity is positive. Thereupon, a control pulse (4A, 5A) for which the duty ratio is controlled is outputted in sync with a pulse ((3) in FIG. 4) that is outputted for each PWM cycle to the positive output terminal PWM-OUT(+), and the control pulse is not outputted to the terminal PWM-OUT(−) for a negative polarity ((10A) in FIG. 4).

4B and 5B in FIG. 4 is a waveform for which the duty ratio is controlled when the polarity is negative. Thereupon, a control pulse (4B, 5B) for which the duty ratio is controlled is outputted in sync with the pulse (FIG. 4 (3)) that is outputted for each PWM cycle to the negative output terminal PWM-OUT(−) and the control pulse is not outputted to the terminal PWM-OUT(+) for a positive polarity (FIG. 4 (10B)).

20A and 20B in FIG. 4 are the same AC control waves comprising PWM control command waves (PWM-OUT(+) and PWM-OUT(−)) that are supplied to a load drive circuit. The polarity switching means performs the aforesaid duty ratio control while alternately switching the polarity of the PWM control waves and the AC output rendered by mixing the output of the positive output terminal and the output of the negative output terminal is supplied to the load drive driver circuit.

When the PWM control command wave in FIG. 3 is inputted to the driver of the AC drive-type load (AC motor), the power supplied to the load can be controlled by switching the voltage of the inverter applied to the load at the determined duty ratio.

Figure 5:
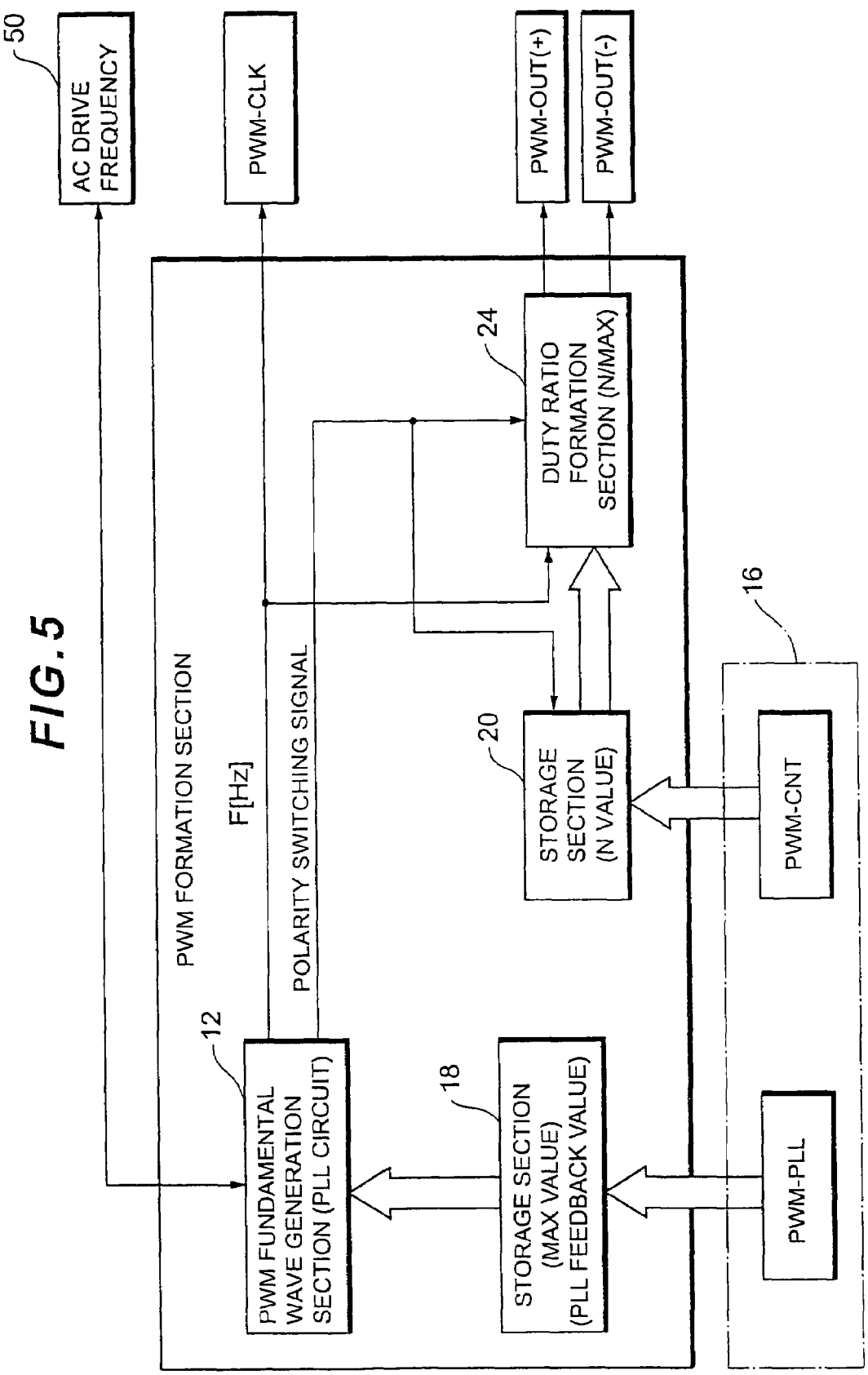
FIG. 5 is a function block diagram of a PWM control block according to a third embodiment.

FIG. 5 relates to the third embodiment and shows that, unlike the second embodiment, an AC drive frequency signal 50 is inputted to the PWM fundamental wave generation circuit 12 and the cycle of the AC drive frequency is maintained as the PWM cycle. The load, for example, the rotational speed of the AC motor can be changed by causing the AC drive frequency to fluctuate. However, according to the embodiment in FIG. 5, the duty ratio of the PWM drive command signal supplied to the load can also be changed in accordance with the operating state of the load.

Figure 6:
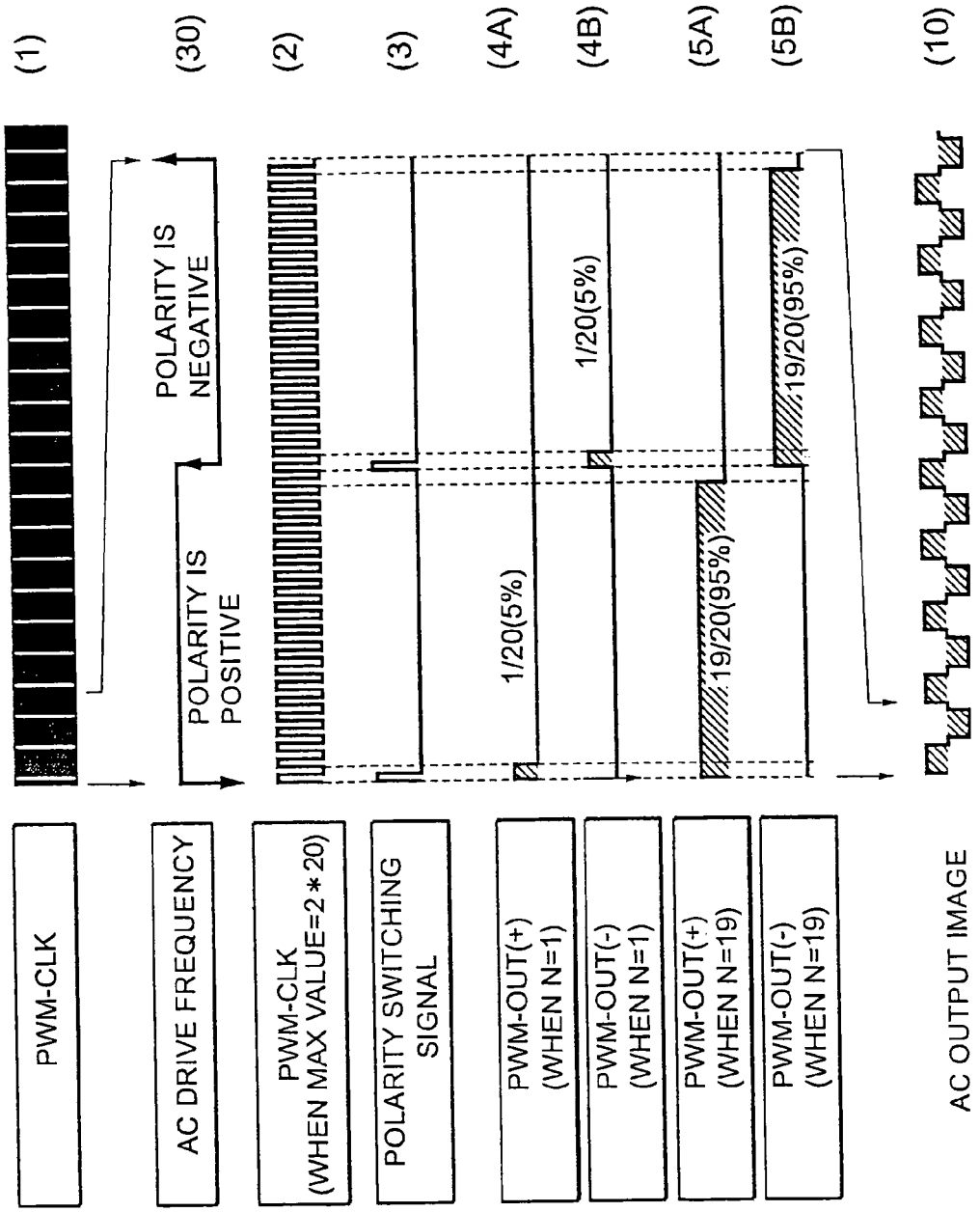
FIG. 6 is a waveform characteristic view of the PWM control block according to the third embodiment.

FIG. 6 shows a control wave characteristic diagram for this embodiment. The PWM fundamental wave generation section 12 locks the PWM cycle to the AC drive frequency so that 2*M pulses of the PWM clock signal (1) arrive in one cycle of the AC drive frequency ((30) in FIG. 6) (3).

The CPU 16 determines N for the setting of the duty value in accordance with the operating state of the load and stores N in the register 18. The duty ratio formation section 24 counts N pulses of PWM clocks for each PWM cycle signal (polarity switching signal) that is outputted for every M pulses of the PWM clock and sets the duty ratio (N/M).

For each output cycle of the polarity switching signal, the duty ratio formation section 24 alternately outputs a PWM control signal with a duty ratio to the positive output terminal (PWM-OUT(+)) and the negative output terminal (PWM-OUT(−)) (5A, 5B). As a result, as shown in (10) in FIG. 6, a cycle corresponding with the AC drive frequency is provided and an AC PWM control wave for which the duty ratio is controlled can be formed.

Figure 7:
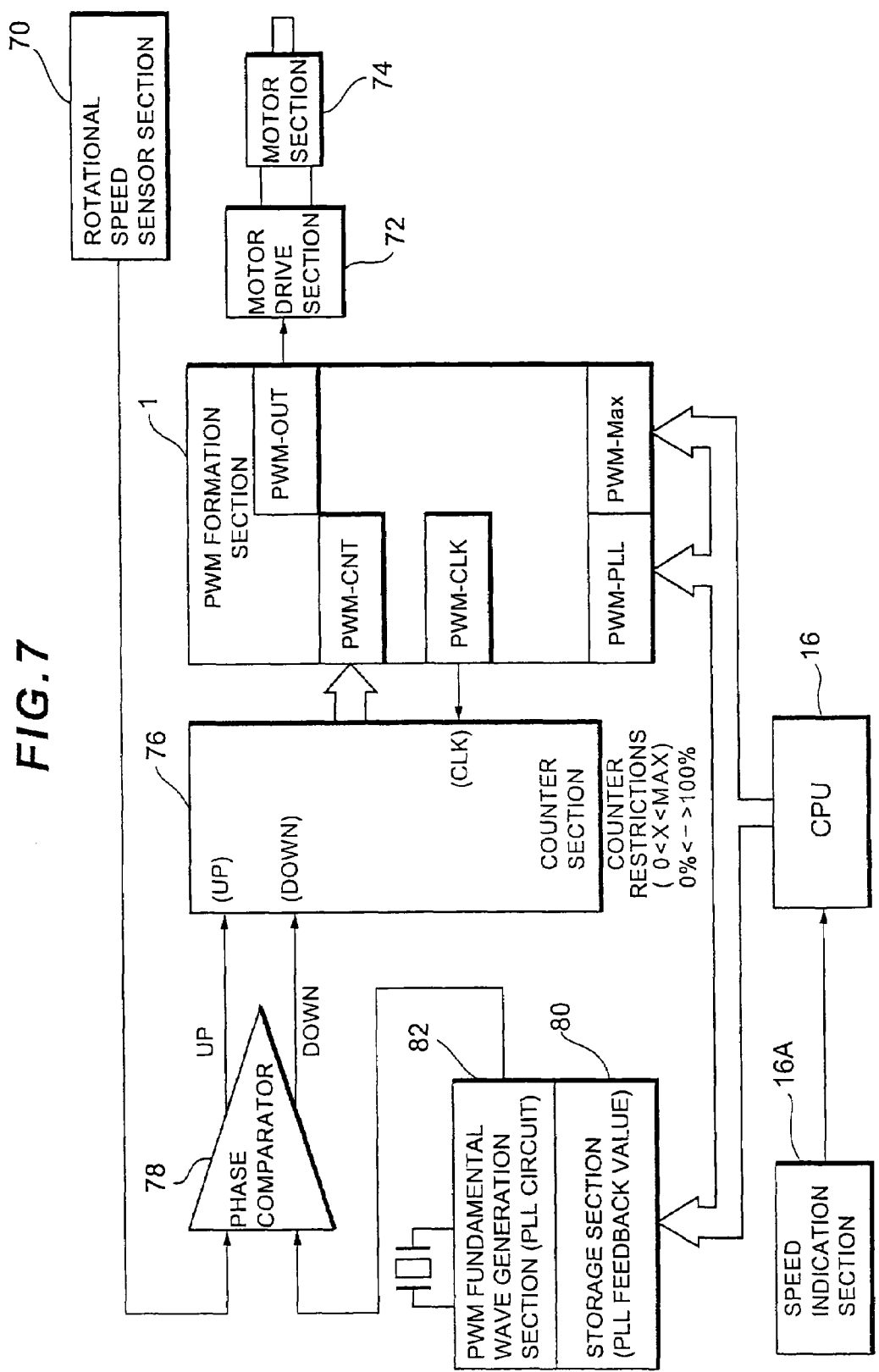
FIG. 7 is a function block diagram showing an embodiment in which the PWM control block is used in a motor speed control system.

FIG. 7 shows an embodiment in which the PWM control circuit 1 in FIG. 1 (or FIGS. 3 and 5) is used in a rotational speed control apparatus of a motor 74. A load operating command control signal (rotational speed indication wave signal) is formed by feeding back the detection signal from the motor via the PLL and synchronizing the detection signal with the load operating state detection signal. As a result, control of the operating state of the load, for example, of the rotational speed of the motor to increase or maintain the speed can be executed.

A variety of motors such as a stepping motor or other DC motor, or an AC motor can be used as the motor. A hole element is provided in the motor and a detection signal is outputted in accordance with the rotational position of the rotor. The detection signal is inputted to a phase comparator 78 of the PLL. A speed indication section 16A for the motor is supplied to the CPU 16.

The CPU 16 determines the division ratio for the indication speed from a storage table in memory and establishes the division ratio in the storage section 80. The PLL circuit of a rotational speed indication formation section 82 reads the division ratio from the storage section 80 and divides the fundamental oscillation frequency by means of the division ratio.

The divided PLL frequency is supplied to the phase comparator 78 and an up or down of the rotational speed of the motor is determined in accordance with the phase comparison result and the command value of either the up or down is supplied to a counter 76. The PWM clock frequency is supplied to the counter.

Figure 8:
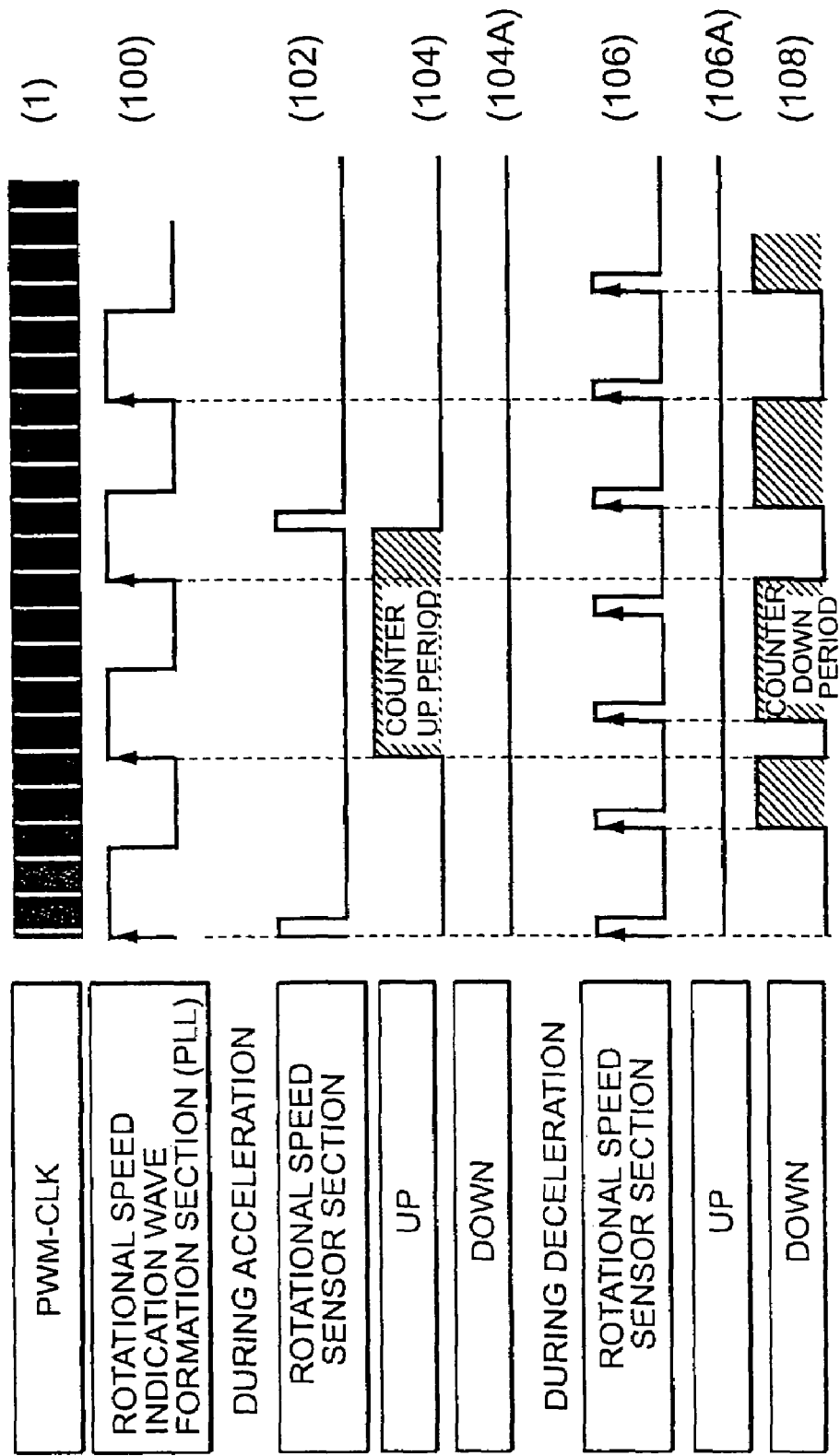
FIG. 8 is a waveform characteristic view of the PWM control block.

FIG. 8 shows the control waveforms, where (1) represents the PWM clock frequency in FIG. 2. (100) is the rotational speed indication wave that is outputted by the rotational speed indication formation section 82. (102) is a detection pulse from a rotational speed sensor 70. The phase comparator 78 outputs a phase difference signal that corresponds to the phase difference between the rotational speed indication wave and detection pulse to the counter 76 in sync with the PWM clock pulse (1) and the counter 76 increases the period counter value (104). When there is an increase in the counter value, the rotational speed of the motor is increased and the count value (N) is established in the PWM control circuit 1 by means of the counter 76. The PWM control circuit determines the duty ratio (N/M) from the N value and outputs the PWM control command signal with the duty ratio in FIG. 1 to the motor drive section 72.

Because the frequency of the detection wave from the rotation speed sensor 70 is low and the rotational speed of the motor is low, the CPU 16 selects the division ratio so that a phase difference with a larger value is produced and establishes the division ratio in the storage section 80. Further, a down command is not outputted by the comparator 78 when the rotational speed of the motor increases (FIG. 8 (104A)).

On the other hand, when there is a decrease of the rotational speed of the motor, that is, when the rotational speed of the motor is reduced from a state where the rotational speed of the motor is high as per (106) in FIG. 8, a phase difference arises between the rotational speed indication pulse and the rotational speed detection pulse as shown in (108). During this time, the count value of the counter 76 is reduced and the count value is sequentially outputted to the PWM control section 1 as a down signal.

When the counter value is reduced and N is accordingly reduced, the PWM control circuit 1 sets the duty ratio low. During deceleration of the motor, an up command is not outputted (106A). The CPU judges the need for an increase or decrease in the rotational speed of the motor from the set speed and the motor rotational speed detection value and sets a counter count-up flag or count-down flag in the counter 76. The counter checks the flag and executes a count-up or count-down in sync with the PWM control clock (1).

Figure 9:
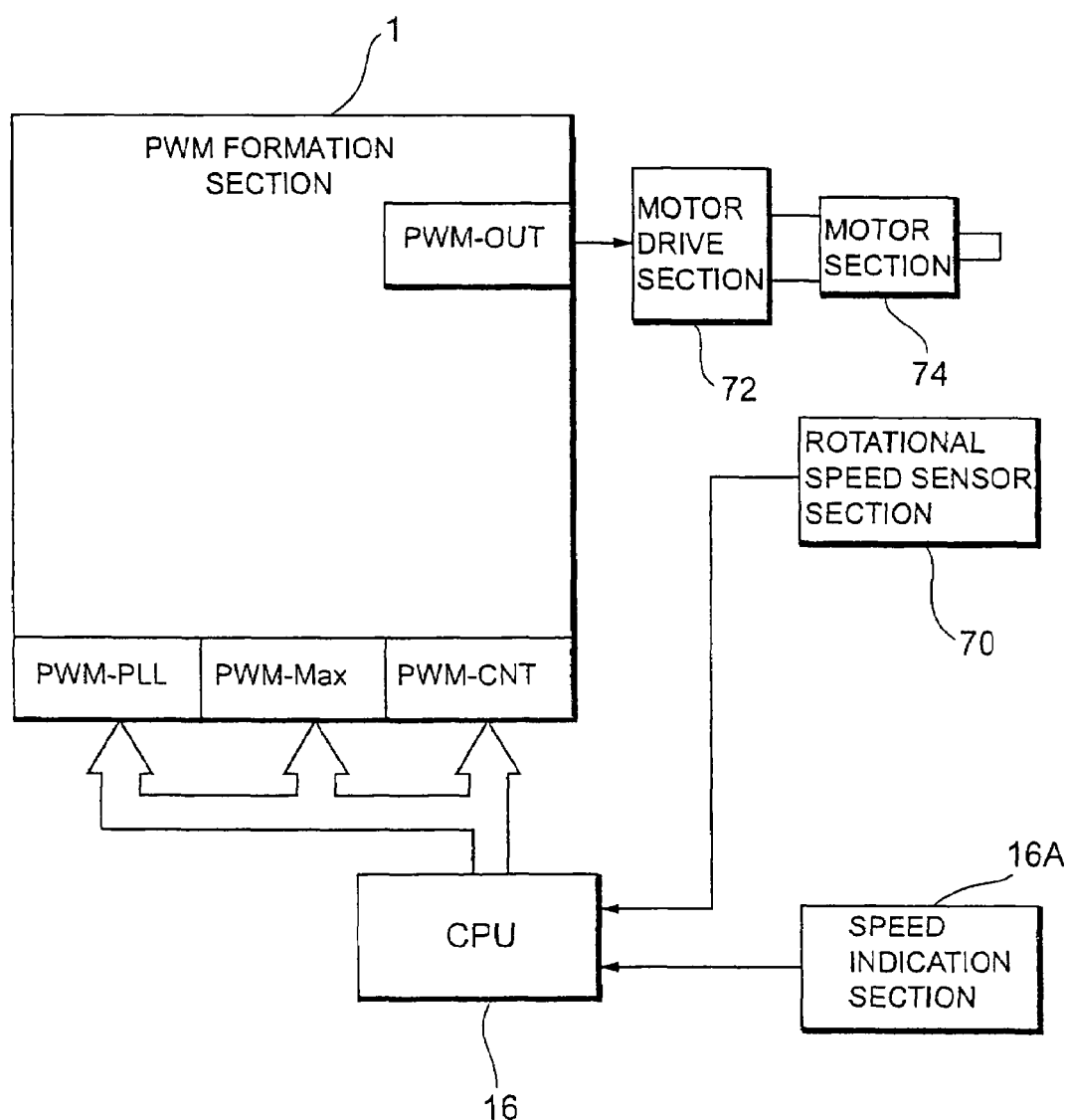
FIG. 9 is a function block diagram in which PWM control is implemented by a personal computer.

FIG. 9 relates to yet another embodiment of the present invention and, unlike the aforementioned embodiments, shows a case where a control block is constituted by a personal computer instead of constituting a control block by a logic circuit gate. The CPU 16 computes the rotational speed of the motor from the detection value of the rotational speed sensor of the motor, compares the rotational speed computation value and the indication value instructed by the speed indication section 16A, and adjusts the duty ratio of the PWM control command signal as shown in FIG. 1 in accordance with the comparison result. That is, when the speed detection value reflects a small speed, the duty ratio (N/M) is increased and, when the speed detection value does not reflect a small speed, the duty ratio is decreased.

The PWM control system described hereinabove has the effect of being able to stably perform PWM drive control corresponding with the PWM cycle in order to make it possible to set the duty ratio on the basis of (N/M) even when the PWM drive frequency (M) fluctuates.

I claim:

1. A motor, comprising:
   a PWM control system comprising PWM fundamental wave generation section that forms a PWM fundamental wave by dividing a fundamental frequency signal; PWM cycle setting section that sets a PWM cycle on the basis of the PWM fundamental wave; duty ratio formation section that forms a duty ratio (N/M:N$\leq$M, where M is the maximum number of clocks) in the PWM cycle; and PWM control signal output section that outputs a PWM control signal with the duty ratio to a motor drive circuit;
   motor operational state detection means;
   motor operational state command means;
   a PLL circuit for dividing the fundamental wave at a division ratio corresponding to the operating command state; and
   comparison section that compares the output from the PLL circuit with the motor operational state detection value, wherein
   the comparison result is supplied to the duty ratio formation section of the PWM system; and
   the PWM control signal of the duty ratio formed in accordance with the comparison result is outputted to the motor drive circuit by the PWM control signal output section.

2. The motor according to claim 1, wherein the PWM cycle setting section sets a frequency generated by dividing the PWM fundamental wave by the M value as the PWM cycle.

3. The motor according to claim 1, further comprising control characteristic setting section that determines the M value and duty ratio set value (N) in accordance with the operating state of the load.

4. The motor according to claim 1, wherein the PWM fundamental wave generation section forms a PWM fundamental frequency signal by M-dividing the fundamental frequency signal by means of a PLL circuit.

5. The motor according to claim 1, wherein the PWM control signal output section outputs the AC PWM control signal by switching the polarity of the outputted PWM control signal.

6. The motor according to claim 4, wherein the PWM fundamental wave generation section is constituted to lock the PWM cycle to the cycle of the AC drive frequency signal.

7. The motor according to claim 1, wherein the PWM fundamental wave generation section forms a fundamental wave for PWM duty control by dividing the fundamental frequency signal by means of a PLL circuit.

8. The motor according to claim 1, wherein the PWM control signal can be formed without comparison with a triangular wave.

9. The motor according to claim 2, further comprising control characteristic setting section that determines the M value and duty ratio set value (N) in accordance with the operating state of the motor.

10. The motor according to claim 2, wherein the PWM control signal output section outputs the AC PWM control signal by switching the polarity of the outputted PWM control signal.

11. The motor according to claim 3, wherein the PWM control signal output section outputs the AC PWM control signal by switching the polarity of the outputted PWM control signal.

12. The motor according to claim 4, wherein the PWM control signal output section outputs the AC PWM control signal by switching the polarity of the outputted PWM control signal.

13. The motor according to 9, wherein the PWM control signal output section outputs the AC PWM control signal by switching the polarity of the outputted PWM control signal.

14. The motor according to claim 1, wherein the motor operational state detection means corresponds to a rotational speed sensor section.

15. The motor according to claim 1, wherein the motor operational state command means corresponds to a speed indication section.

16. A motor, comprising:
a PWM control system comprising PWM fundamental wave generation section that forms a PWM fundamental wave by dividing a fundamental frequency signal; PWM cycle setting section that sets a PWM cycle on the basis of the PWM fundamental wave; duty ratio formation section that forms a duty ratio (N/M:N≦M, where M is the maximum number of clocks) in the PWM cycle; and PWM control signal output section that outputs a PWM control signal with the duty ratio to a motor drive circuit;
motor operational state detection section;
motor operational state command section;
a circuit for dividing the fundamental wave at a division ratio corresponding to the operating command state; and
comparison section that compares the output from the circuit with the motor operational state detection value, wherein
the comparison result is supplied to the duty ratio formation section of the PWM system; and
the PWM control signal of the duty ratio formed in accordance with the comparison result is outputted to the motor drive circuit by the PWM control signal output section.

* * * * *